(12) United States Patent  
Maeda

(10) Patent No.: US 7,474,006 B2  
(45) Date of Patent: Jan. 6, 2009

(54) PACKAGE BOARD AND SEMICONDUCTOR DEVICE

(75) Inventor: Masato Maeda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/542,220

(22) Filed: Oct. 4, 2006

(65) Prior Publication Data

US 2007/0075438 A1    Apr. 5, 2007

(30) Foreign Application Priority Data

Oct. 5, 2005    (JP)    ............................. 2005-292803

(51) Int. Cl.  
*H01L 23/48*    (2006.01)

(52) U.S. Cl. ........................ 257/778; 257/737; 257/738; 257/E21.499; 257/E21.503; 257/E23.069

(58) Field of Classification Search ................ 257/778, 257/737, 738, E21.499, E21.503, E23.069  
See application file for complete search history.

(56) References Cited

U.S. PATENT DOCUMENTS

| 6,049,122 A | * | 4/2000 | Yoneda | ........................ 257/668 |
| 7,005,585 B2 | * | 2/2006 | Ishizaki | ....................... 174/260 |
| 2004/0040742 A1 | * | 3/2004 | Ishizaki | ....................... 174/257 |

FOREIGN PATENT DOCUMENTS

JP    11-186322    11/1999

* cited by examiner

*Primary Examiner*—Andy Huynh  
(74) *Attorney, Agent, or Firm*—Young & Thompson

(57) ABSTRACT

A package board for flip-chip packaging on whose one surface an element is mounted in a facedown manner is provided. The package board has: an interconnection provided on the one surface; a bump formation region in which a bump electrically connecting the interconnection with an electrode pad of the element is provided; and an insulating film covering a part of the one surface outside of the bump formation region. The insulating film includes a girdle-shaped insulating film that is provided around a region and along a side of the bump formation region opposite to an edge of the package board. The insulating film further has an opening section formed within the region.

14 Claims, 3 Drawing Sheets

50

50

150

PACKAGE BOARD AND SEMICONDUCTOR DEVICE

BACKGROUND OF THE INVENTION

1. Field of the Invention

The present invention relates to a package board and a semiconductor device using the package board.

2. Description of the Related Art

In recent years, a demand on a small-size, thin, high-speed semiconductor device is increasing. In order to meet such a demand, a flip-chip connection technique is introduced in which a semiconductor chip is directly mounted on a package board in a facedown manner. According to a conventional wire bonding technique, a semiconductor chip has been connected to a gold bonding wire. On the other hand, according to the flip-chip connection technique, gold stud bumps and the like are formed on electrode pads of the semiconductor chip, and thereby the flip-chip connection between the semiconductor chip and the package board is achieved. The flip-chip connection can be achieved at relatively low cost.

There are several methods for electrically connecting a semiconductor chip and a package board. A method described in Japanese Laid Open Patent Application JP-A-Heisei 11-186322 is known as a method with comparatively high connection reliability. According to the method, solder coating is performed for the package board in advance, and the semiconductor chip and the package board are electrically connected with each other by applying heat, load and so on. Here, it is necessary to stabilize the amount of solder supplied to the connection region and behavior of the solder at the time of establishing the connection. Therefore, with regard to the package board used in the above-mentioned method, the solder coating is limited to interconnections near the connection region, and the region other than the solder coating region is coated with insulating resin and the like.

Hereinafter, an example of the conventional flip-chip connection technique is explained with reference to FIGS. 1 and 2. FIG. 1 is a plan view schematically illustrating a semiconductor device according to the conventional technique. FIG. 2 schematically illustrates a cross-section along a line Y-Y' in FIG. 1.

In a semiconductor device 50, an interconnection 4 is provided on a board 2, and a bump 10 is formed on an electrode pad (not shown) of a semiconductor chip 12. An insulating film including first insulating layer 6 and second insulating layer 8 are formed on the board 2. Solder 14 is provided in a connection region. In the connection region, the interconnection 4 and the bump 10 are connected to each other through the solder 14. As shown in FIGS. 1 and 2, a package board 2 has a first insulating layer 6, a second insulating layer 8, and an opening section between the first insulating layer 6 and the second insulating layer 8. The opening section is larger than the connection region. The second insulating layer 8 covers all over an internal region that is on a side of the opening section. A portion of the interconnection 4 that is covered with neither the first insulating layer 6 nor the second insulating layer 8 is exposed, and the exposed portion of the interconnection 4 can be coated with the solder 14 according to the semiconductor device 50. In the solder-coated portion, the connection to the bump 10 formed on the electrode pad (not shown) of the semiconductor chip 12 is achieved. The semiconductor chip 12 is connected in a facedown manner to the solder-coated portion by appropriately applying heat, load, supersonic wave and so forth. It should be noted in FIG. 1 that a dotted line 15 represents a region in which the semiconductor chip 12 is provided.

In order to prevent stress concentration to the connection portion or rupture of the connection portion due to difference of rate of thermal expansion between the semiconductor chip 12 and the package board 1, the space between the semiconductor chip 12 and the package board 1 may be filled with sealing resin 18 as stress relaxation resin material as shown in FIG. 2. Usually, the stress relaxation resin material 18 is supplied in the form of a liquid. In many cases, the stress relaxation resin material 18 is supplied after the semiconductor chip 12 and the package board 1 are connected with each other.

For example, the liquid stress relaxation resin material 18 is supplied in the following way.

A thin tube called "needle" is attached to a tip of a cylindrical container called "syringe". A tip of the needle is brought near the semiconductor chip 12 that is connected to the package board 1. Subsequently, the liquid stress relaxation resin material is discharged from the tip of the needle by applying pressure and so forth. The liquid stress relaxation resin material discharged from the tip of the needle spreads between the semiconductor chip 12 and the package board 1 due to the capillary phenomenon.

SUMMARY OF THE INVENTION

There are problems with the conventional technique in the following points. The resin material 18 must spread over the second insulating layer 8 on the side of the connection region, and it may be difficult for the resin material 18 to spread into the central region by means of the capillary phenomenon.

In addition, the insulating layer is not provided in the connection region where the semiconductor chip 12 and the package board 1 are connected. Thus, the gap between the semiconductor chip 12 and the package board 1 is broader at the connection region than at the other region where the insulating layer is provided. Therefore, the liquid resin material 18 tends to flow mainly in the connection region. The liquid resin material 18 spreads more quickly over the periphery of the semiconductor device 50 rather than into the center of the semiconductor device 50. As a result, an air pocket called "void" may remain under the semiconductor chip 12. Therefore, crack and/or exfoliation originating from the void may occur due to heat stress during an assembly process, an environment testing process and so forth. If the crack and/or the exfoliation reach the connection region between the semiconductor chip 12 and the package board 1, the connection reliability is deteriorated.

In an aspect of the present invention, a package board for flip-chip packaging on whose one surface an element is mounted in a facedown manner is provided. The package board has: an interconnection provided on the one surface; a bump formation region in which a bump electrically connecting the interconnection with an electrode pad of the element is provided; and an insulating film covering a part of the one surface outside of the bump formation region. The insulating film includes a girdle-shaped insulating film that is provided around a region and along a side of the bump formation region opposite to an edge of the package board. The insulating film further has an opening section formed within the above-mentioned region surrounded by the girdle-shaped insulating film.

According to the present invention, the insulating film is formed to include the girdle-shaped insulating film provided around the region and along a side of the bump formation region opposite to the edge of the package board and to have the opening section within the region surrounded by the girdle-shaped insulating film. Therefore, liquid sealing resin can easily spread into the above-mentioned region (the opening section) under the element, when the element and the package board are packaged by injecting the liquid sealing resin after the element and the package board are connected with each other. As a result, the liquid sealing resin spreads all over the space (gap) between the element and the package board, and thus the occurrence of voids can be suppressed. It is thus possible to suppress the occurrence of crack and/or exfoliation originating from the void that is caused by heat stress applied during the packaging process, and hence to improve the connection reliability in the bump formation region.

In another aspect of the present invention, a semiconductor device is provided. The semiconductor device has a package board and a semiconductor chip. The semiconductor chip is mounted on one surface of the package board and has a flip-chip connection to the package board. The package board has: an interconnection provided on the one surface; a bump formation region in which a bump electrically connecting the interconnection with an electrode pad of the semiconductor chip is provided; and an insulating film covering a part of the one surface outside of the bump formation region. The insulating film includes a girdle-shaped insulating film that is provided around a region and along a side of the bump formation region opposite to an edge of the package board. The insulating film further has an opening section formed within the above-mentioned region surrounded by the girdle-shaped insulating film.

According to the present invention, the semiconductor chip is mounted on the package board in which the girdle-shaped insulating film is provided along the side of the bump formation region and the opening section is provided within the region on a side of the girdle-shaped insulating film. It is therefore possible to obtain the semiconductor device having excellent connection reliability.

According to the present invention, the girdle-shaped insulating film is provided around the region and along the side of the bump formation region opposite to the edge of the package board. Furthermore, provided within the region surrounded by the girdle-shaped insulating film is not an insulating film but the opening section. Therefore, the liquid sealing resin can easily spreads into the opening section at the time of packaging the element and the package board. It is therefore possible to suppress the occurrence of the voids in the sealing resin and hence to suppress the occurrence of crack and/or exfoliation in the sealing resin. As a result, the connection reliability in the bump formation region can be improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiments of the present invention will be described with reference to the attached drawings. In the respective drawings, the same numerals are given to the same elements, and redundant explanation will be omitted suitably.

Figure 1:
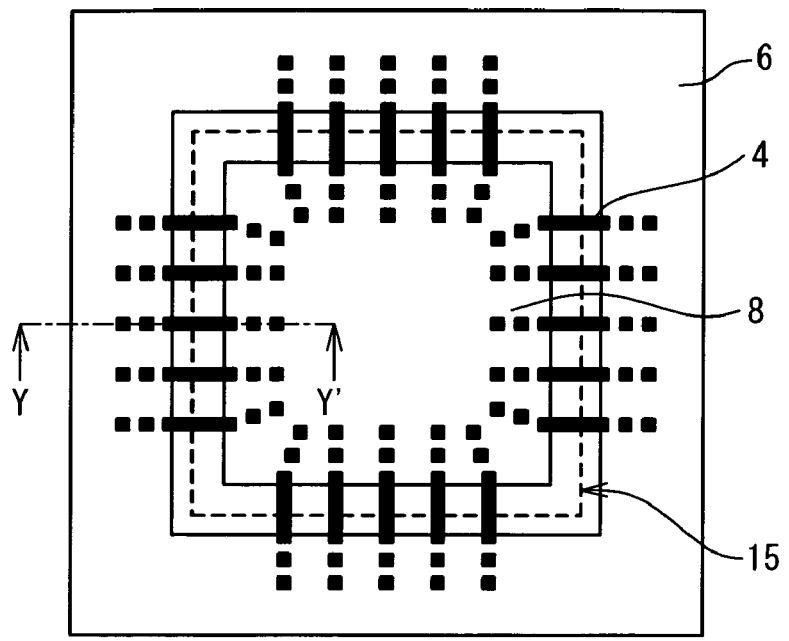
FIG. 1 is a plan view schematically illustrating a semiconductor device according to the conventional technique.
Figure 2:
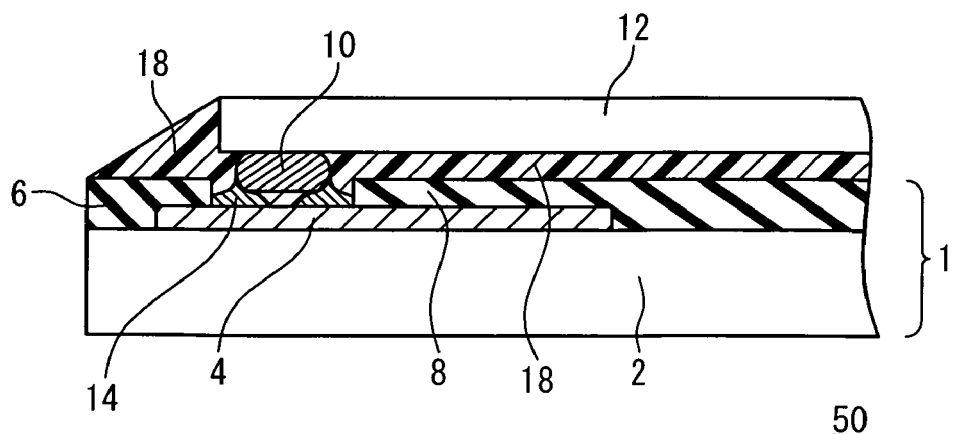
FIG. 2 is a cross-sectional view schematically illustrating the semiconductor device according to the conventional technique.
Figure 3:
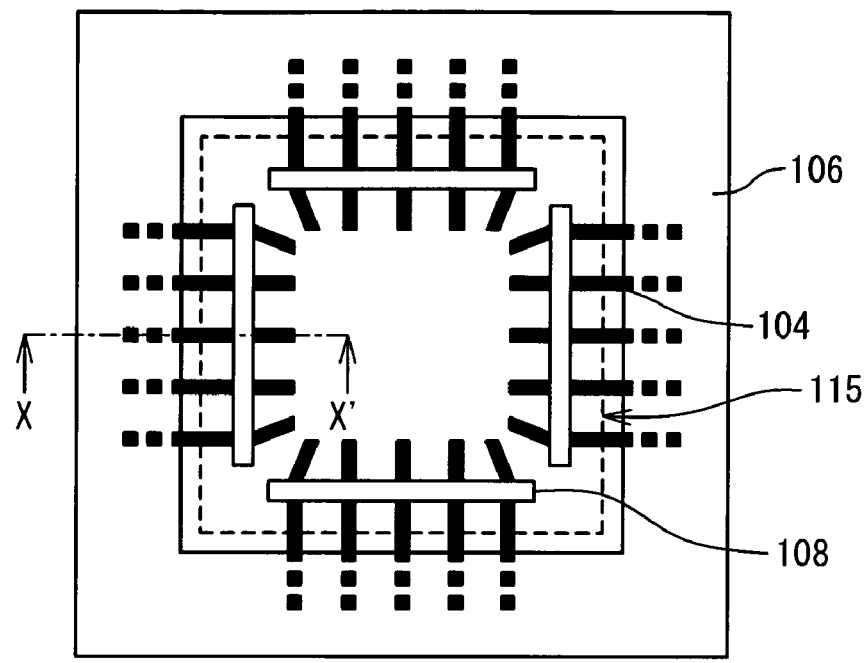
FIG. 3 is a plan view schematically illustrating a semiconductor device according to an embodiment of the present invention.
Figure 4:
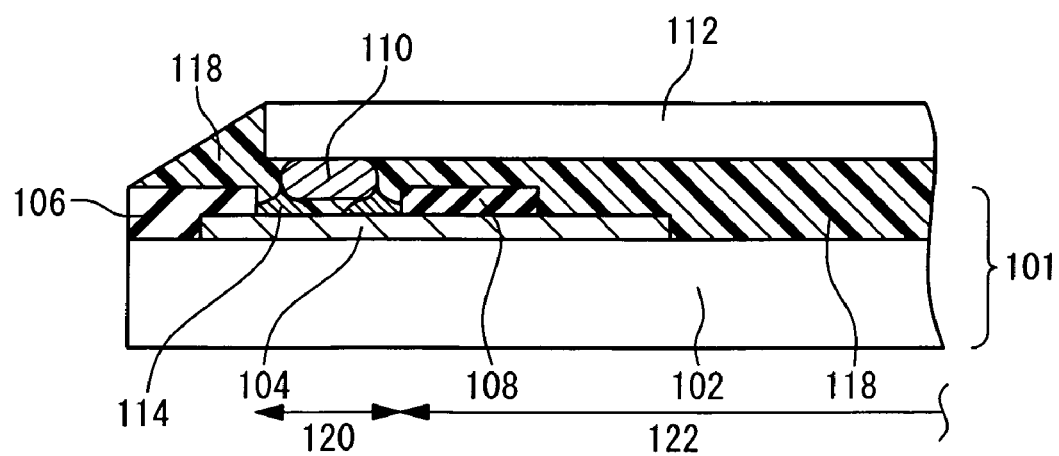
FIG. 4 is a cross-sectional view schematically illustrating the semiconductor device according to the embodiment of the present invention.

A semiconductor device 100 shown in FIGS. 3 and 4 has a board (a package board 101) for flip-flop packaging and an element (a semiconductor chip 112). The element (the semiconductor chip 112) is mounted on one surface of the board (the package board 101) in facedown manner and has a flip-chip connection to the board (the package board 101). The board (the package board 101) has: an interconnection 104 provided on the one surface; a bump formation region (a connection region 120) in which a bump 110 electrically connecting the interconnection 104 with an electrode pad (not shown) of the element (the semiconductor chip 112) is provided; and an insulating film (a first insulating layer 106 and a second insulating layer 108) covering a part of the one surface outside of the bump formation region (the connection region 120, connection portion 120). The insulating film includes a girdle-shaped insulating film (the second insulating layer 108) that is provided around a region (that is a central part of a second region 122) and along a side of the bump formation region (the connection region 120) opposite to an edge of the board (the package board 101). The insulating film further has an opening section (located near a central section of the second region 122) formed within the above-mentioned region (the central part of the second region 122).

FIG. 3 is a plan view illustrating the semiconductor device 100 according to the present embodiment. FIG. 4 is a cross-sectional view along a line X-X' in FIG. 3. In FIG. 3, the semiconductor chip 112, a sealing resin 118 and solder 114 in the semiconductor device 100 illustrated in FIG. 4 are not shown. A dotted line 115 in FIG. 3 represents a region in which the semiconductor chip 112 is provided.

The semiconductor device 100 includes the package board 101, the semiconductor chip 112, and the sealing resin 118. In the present embodiment, the semiconductor chip 112 is connected to the package board 101 in a facedown manner.

The package board 101 includes a base material 102, the interconnection 104, the first insulating layer 106, the second insulating layer 108, and solder 114. The interconnection 104 is provided to contact with an upper surface of the base material 102. The first insulating layer 106 is provided to contact with the upper surface of the base material 102 and an upper surface of the interconnection 104. The second insulating layer 108 is provided to contact with the upper surface of the interconnection 104. The solder 114 is provided to contact with the upper surface of the interconnection 104 in a connection region 120 (connection portion 120) where the semiconductor chip 112 is connected to the package board 101. In the present embodiment, the package board 101 is a printed circuit board to which the semiconductor chip 112 is connected in the flip chip bonding manner. As shown in FIG. 3, the package board 101 in the present embodiment has a rectangular shape.

The semiconductor chip 112 is an IC (Integrated Circuit) chip, for example. The semiconductor chip 112 has an electrode pad (not shown) on an undersurface thereof and the bump 110 formed on the electrode pad. The semiconductor chip 112 is mounted on the upper surface of the package board 101 in a facedown manner and has a flip-chip connection to the circuit board 101. The bump 110 is electrically connected with the electrode pad.

The sealing resin 118 is, for example, epoxy-based insulating resin. The sealing resin 118 has a function of preventing stress concentration to the connection portion 120 or rupture of the connection portion 120 due to difference of rate of thermal expansion between the semiconductor chip 112 and the package board 101. The sealing resin 118 is provided after the semiconductor chip 112 is mounted on the package board 101. The sealing resin 118 has flowability before it is hardened. Resin with low viscosity is used as the sealing resin 118.

The base material 102 is composed of, for example, epoxy resin and the like. The base material 102 serves as a main body of the package board 101.

The interconnection 104 is composed of, for example, copper and the like. The interconnection 104 electrically connects the package board 101 and the semiconductor chip 112 through the solder 114 and the bump 110. A plurality of interconnections 104 are provided on the package board 101 and have a predetermined pattern.

In the connection region 120 (bump formation region), the solder 114 and the bump 110 are provided. In other words, the bump 110 formed on the electrode pad of the semiconductor chip 112 is aligned to the connection region 120 of the package board 101. The connection region 120 is a region where the package board 101 and the semiconductor chip 112 are electrically connected to each other.

The first insulating layer 106 and the second insulating layer 108 are composed of, for example, organic resin such as mixture of epoxy resin and acrylic resin. The first insulating layer 106 and the second insulating layer 108 functions as an insulating film covering a part of the surface of the interconnection 104 outside of the connection region 120 (bump formation region). Moreover, the first insulating layer 106 and the second insulating layer 108 functions as a solder resist which prevents the solder 114 from adhering to undesirable portions. The first insulating layer 106 (an outer insulating layer 106) is provided to cover the surfaces of the interconnection 104 and the base material 102 between the connection region 120 and an edge of the circuit board 101.

As shown in FIG. 4, the connection region 120 is located between the first insulating layer 106 and a region 122 (referred to as a second region 122 hereinafter). The second region 122 corresponds to an inner part of the package board 101. The second insulating layer 108 is provided within the second region 122. That is, the first insulating layer 106 (an outer insulating layer) is provided along edges of the circuit board 101, while the second insulating layer 108 (an inner insulating layer) is provided nearer to the center of the circuit board 101. Here, the insulating layer 108 is formed to cover a part of the second region 122, i.e., not all the second region 122 is covered by the insulating layer 108. As shown in FIG. 4, the second insulating layer 108 is provided along a side of the connection region 120 opposite to the edge of the circuit board 101, i.e., the second insulating layer 108 is positioned at peripheral region of the second region 122. The connection region 120 is located between the first insulating layer 106 and the second insulating layer 108.

As shown in FIG. 3, the second insulating layer 108 is provided in a girdle-form around a central region (the central portion of the second region 122). Thus, the second insulating layer 108 according to the present embodiment can be referred to as a girdle-shaped insulating film around the central region. More specifically, the second insulating layer 108 includes a plurality of rectangular-shaped insulating films 108 that are arrange in the girdle-form around the central region. Respective of the rectangular-shaped insulating films 108 are provided substantially parallel to respective sides of the rectangular package board 101. Each of the rectangular-shaped insulating films 108 is provided along the side of the connection region 120 and around the central region. There is a gap between adjacent two rectangular-shaped insulating films 108. The rectangular-shaped insulating films 108 are separated from each other near the corner of the package board 101.

As described above, the second insulating layer 108 is provided around the central region of the second region 122 and covers only a part of the second region 122. The remaining part of the second region 122 corresponds to an opening section. In other words, the insulating film of the package board 101 according to the present embodiment has an opening section that is formed within the above-mentioned central region (near the center of the package board 101). In the present embodiment, the opening section is formed all over the central region surrounded by the second insulating layer 108.

The solder 114 is provided for electrically connecting the interconnection 104 and the semiconductor chip 112. For example, lead-free solder and the like is used as the solder 114.

The bump 110 is made of, for example, gold, aluminum or the like. The bump 110 electrically connects the semiconductor chip 112 and the interconnection 104 through the solder 114.

An example of processes of manufacturing the semiconductor device 100 according to the present embodiment is described hereinafter.

First, the interconnection 104 is formed on the base material 102 by using, for example, a plating method.

Subsequently, an insulating film is formed on the base material 102 and the interconnection 104. Then, a photoresist is formed on the insulating film, and the photo-resist is patterned through a lithography method. Then, the first insulating layer 106 and the second insulating layer 108 are formed by using a dry etching technique. At this time, a portion of the interconnection 104 between the first insulating layer 106 and the second insulating layer 108 is exposed.

Next, the solder 114 is provided on the exposed portion of the interconnection 104 between the first insulating layer 106 and the second insulating layer 108.

Next, the solder 114 provided on the package board 101 and the bump 110 provided on the undersurface of the semiconductor chip 112 are connected with each other. Here, after the solder 114 is fused through a heating process, the solder 114 is connected to the bump 110. After that, a cooling process is performed, and thus the solder 114 and the bump 110 are fixed.

Next, the sealing resin 118 is supplied between the package board 101 and the semiconductor chip 112. The sealing resin 118 is supplied, for example, through the following processes.

First, a thin tube called "needle" is attached to a tip of a cylindrical container called "syringe". A tip of the needle is brought near the semiconductor chip 112 that is connected to the package board 101. Subsequently, the sealing resin 118 is discharged from the tip of the needle by applying pressure and so forth. The sealing resin 118 discharged from the tip of the needle spreads between the semiconductor chip 112 and the package board 101 due to the capillary phenomenon. In this manner, the sealing resin 118 is injected into a space between the package board 101 and the semiconductor chip 112. The sealing resin 118 is hardened as the temperature falls, and thereby the sealing resin 118 is provided between the package board 101 and the semiconductor chip 112.

The semiconductor device 100 is manufactured by the above-described processes.

Hereinafter, effects of the semiconductor device 100 according to the present embodiment will be described.

In the semiconductor device 100, the second insulating layers 108 (rectangular-shaped insulating films) are formed to cover only a part of the second region 122 on a side of the connection region 120. As shown in FIG. 3, the second insulating layers 108 are provided in respective sides of the rectangular package board 101 to form a girdle shape. That is, the second insulating layers 108 are provided around the central region of the second region 122 and along a side of the connection region 120. Within the central region of the second region 122 (the region at the center of the package board 101), the second insulating layers 108 are not provided, but the opening section of the insulating film is provided. Therefore, the liquid sealing resin 118 can easily spread into the central region of the package board 101 under the semiconductor chip 112, when the semiconductor chip 112 and the package board 101 are packaged by injecting the liquid sealing resin 118 after the semiconductor chip 112 and the package board 101 are connected with each other. As a result, the liquid sealing resin 118 spreads all over the space (gap) between the semiconductor chip 112 and the package board 101, and thus the occurrence of voids can be suppressed. It is thus possible to suppress the occurrence of crack and/or exfoliation in the sealing resin 118 during the assembly process.

Moreover, there is a gap between adjacent two second insulating layers 108, and the second insulating layers 108 are separated from each other near the corner of the package board 101. Therefore, when the sealing resin 118 is injected into the space between the semiconductor chip 112 and the package board 101, the sealing resin 118 spreads into the central region of the package board 101 not only over the second insulating layer 108 but also through the gap between the adjacent second insulating layers 108. In other words, the spreading paths of the sealing resin 118 are increased. Thus, the sealing resin 118 can spread more smoothly into the central region of the second region 122.

Furthermore, the first insulating layer 106 (outer insulating film) is provided to cover the surface of the package board 101 between the connection region 120 and the edge of the package board 101. It is thus possible to improve insulation performance of the semiconductor device 100 and hence to improve the reliability.

The embodiment of the present invention described above with reference to the drawings is merely an exemplification of the present invention. Various structures other than the above can be employed.

For example, in the above embodiment, the semiconductor chip 112 mounted on the package board 101 is an IC chip. However, any semiconductor element other than the IC chip, such as an LSI, may be mounted on the package board 101. Furthermore, any element other than the semiconductor element may be mounted on the package board 101.

Also described in the above embodiment is a case where the second insulating layers 108 are separated from each other near the corners of the rectangular package board 101.

However, the second insulating layers 108 are not necessarily separated from each other near the corners, as long as the second insulating layer 108 is not provided within the above-mentioned central region of the second region 122. For example, the second insulating layer 108 can have a ring shape around the central region.

Figure 5:
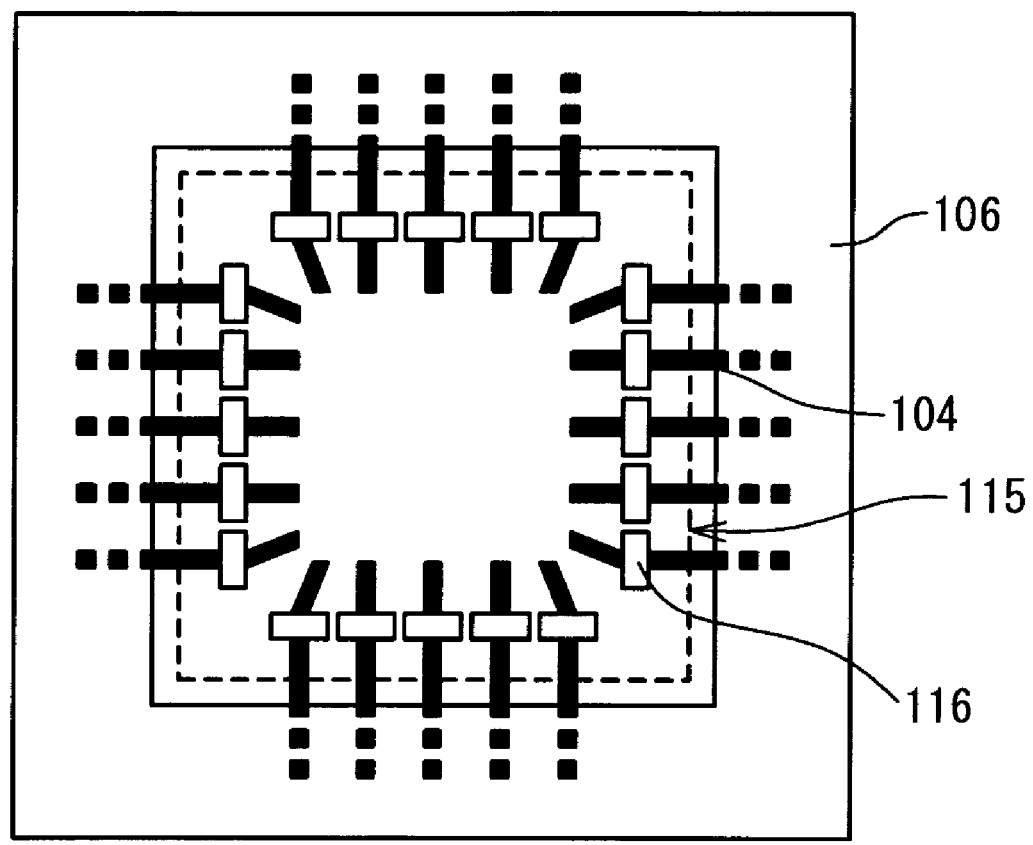
FIG. 5 is a plan view schematically illustrating a semiconductor device according to another embodiment of the present invention.

FIG. 5 is a plan view illustrating a semiconductor device 150 according to another embodiment of the present invention. In FIG. 5, a second insulating layer 116 is provided instead of the foregoing second insulating layer 108. The second insulating layer 116 has a girdle-shape and is provided around the central region of the second region 122. The second insulating layer 116 in each side of the package board 101 has slits (openings). Each slit is formed in a region where the interconnection 104 is not provided. In other words, the second insulating layer 116 is not formed at other than a region where the interconnection 104 is provided. The second insulating layer 116 has the slits (openings) at a region between adjacent interconnections 104. Here, the region between adjacent interconnections 104 does not include vicinity of each interconnection 104. Since the second insulating layer 116 has the slits in addition to the gap at the corner, the spreading paths through which the sealing resin 118 spreads into the central region of the semiconductor device 150 are increased. Therefore, the sealing resin 118 can spread into the central region of the second region 122 further easily, and thus the occurrence of the voids in the sealing resin 118 can be further suppressed.

It is apparent that the present invention is not limited to the above embodiment and may be modified and changed without departing from the scope and spirit of the invention.

What is claimed is:

1. A package board for flip-chip packaging on whose one surface an element is mounted in a facedown manner, comprising:
   an interconnection provided on said one surface;
   a bump formation region in which a bump electrically connecting said interconnection with an electrode pad of said element is provided; and
   a strip-shaped insulating film covering a part of said interconnection outside of said bump formation region,
   wherein said strip-shaped insulating film is provided to surround all sides of a central region of said element and along a side of said bump formation region opposite to an edge of said package board, and said strip-shaped insulating film further has an opening section formed within said central region.

2. The package board according to claim 1,
   wherein said opening section is formed all over said central region.

3. The package board according to claim 1,
   wherein said strip-shaped insulating film includes a plurality of rectangular-shaped insulating films that surround said central region.

4. The package board according to claim 1,
   further comprises an outer insulating film covering said one surface between said bump formation region and said edge of said package board.

5. The package board according to claim 1,
   wherein said strip-shaped insulating film has a slit formed in a region where said interconnection is not provided.

6. A semiconductor device comprising:
   a package board; and
   a semiconductor chip mounted on one surface of said package board and having a flip-chip connection to said package board, said package board including:

an interconnection provided on said one surface;

a bump formation region in which a bump electrically connecting said interconnection with an electrode pad of said semiconductor chip is provided; and a strip-shaped insulating film covering a part of said interconnection outside of said bump formation region, wherein said strip-shaped insulating film is provided around each side of a central region of said semiconductor chip and along a side of said bump formation region opposite to an edge of said package board, and said strip-shaped insulating film further has an opening section formed within said central region.

7. The semiconductor device according to claim 6, wherein said opening section is formed all over said central region.

8. The semiconductor device according to claim 6, wherein said strip-shaped insulating film includes a plurality of rectangular-shaped insulating films that are provided around said central region.

9. The semiconductor device according to claim 6, further comprising an outer insulating film covering said one surface between said bump formation region and said edge of said package board.

10. The semiconductor device according to claim 6, wherein said strip-shaped insulating film has a slit formed in a region where said interconnection is not provided.

11. A package board for flip-chip packaging having an element mounted on a first surface thereof in a facedown manner, said package board comprising:

an interconnection provided on said first surface;

a bump electrically connecting said interconnection with said element; and a strip-shaped insulating film covering a part of said interconnection outside of said bump, said strip-shaped insulating film surrounding all sides of a central region of said element and defining an opening exposing an end of said interconnection in said central region.

12. The package board according to claim 11, wherein said strip-shaped insulating film comprises plural discrete elongate rectangular-shaped insulating films that surround said central region.

13. The package board according to claim 12, wherein each of said rectangular-shaped insulating films has a slit formed in a region where said interconnection is not provided.

14. The package board according to claim 11, further comprising an outer insulating film covering said one surface between said bump and an edge of said package board.

* * * * *